US011025238B2

(12) United States Patent
Wu (10) Patent No.: US 11,025,238 B2
(45) Date of Patent: *Jun. 1, 2021

(54) LEVEL-SHIFTING CIRCUIT CONFIGURED TO LIMIT LEAKAGE CURRENT

(71) Applicant: SEMICONDUCTOR COMPONENTS INDUSTRIES, LLC, Phoenix, AZ (US)

(72) Inventor: Eric Wu, Beijing (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/562,793

(22) Filed: Sep. 6, 2019

(65) Prior Publication Data

US 2019/0393866 A1   Dec. 26, 2019

Related U.S. Application Data

(63) Continuation of application No. 15/893,909, filed on Feb. 12, 2018, now Pat. No. 10,411,678.

(51) Int. Cl.
*H03K 3/356* (2006.01)
*H03K 5/08* (2006.01)

(52) U.S. Cl.
CPC ......... *H03K 3/356165* (2013.01); *H03K 5/08* (2013.01)

(58) Field of Classification Search
CPC . H01L 27/00; H01L 27/0248; H01L 27/0255; H03K 17/00; H03K 17/30; H03K 19/00; H03K 19/003; H03K 19/00361; H03K 19/0185; H03K 19/018507; H03K 19/018521; H03K 3/00; H03K 3/356; H03K 3/356113; H03K 3/356165; H03K 5/00; H03K 5/07; H03K 5/08; H03K 5/22;

(Continued)

(56) References Cited

U.S. PATENT DOCUMENTS 5,661,431 A * 8/1997 Ueno ............... H03K 19/00307
327/483
8,581,638 B2 11/2013 Chen et al.
2004/0217798 A1 11/2004 Lencioni
(Continued)

FOREIGN PATENT DOCUMENTS

TW            200701641 A       1/2007

*Primary Examiner* — Lincoln D Donovan
*Assistant Examiner* — Dave Mattison
(74) *Attorney, Agent, or Firm* — Brake Hughes Bellermann LLP (57) ABSTRACT

In one general aspect, a level-shifting circuit includes a first supply terminal configured to receive a first supply voltage, and a second supply terminal configured to receive a second supply voltage different from the first supply voltage. The level-shifting circuit includes a shifting circuit having electrical connections to an input terminal and an output terminal and configured to, in response to a first voltage at a first node, produce a second voltage at a second node. The shifting circuit is used to shift a first voltage level to a second voltage level. The level-shifting circuit includes a clamping circuit having an electrical connection to the first node where the clamping circuit is configured to limit current at the first node from flowing to a ground.

21 Claims, 10 Drawing Sheets

(58) Field of Classification Search
CPC ... H02H 9/00; H02H 9/041; H02J 7/00; H02J 7/0031
USPC ........................................................ 327/390
See application file for complete search history.

(56) References Cited

U.S. PATENT DOCUMENTS

| | | |
|---|---|---|
| 2011/0025397 A1 | 2/2011 | Wang et al. |
| 2016/0105163 A1* | 4/2016 | Chen ................ H03K 3/356165 327/333 |
| 2016/0204696 A1* | 7/2016 | Snowdon ................ H02M 3/07 327/536 |

* cited by examiner

LEVEL-SHIFTING CIRCUIT CONFIGURED TO LIMIT LEAKAGE CURRENT

RELATED APPLICATION

This application is related to and is a continuation of U.S. Non-provisional application Ser. No. 15/893,909, filed on Feb. 12, 2018, which is incorporated herein by reference in its entirety.

TECHNICAL FIELD

This description relates to a circuit configuration of a level-shifting circuit to limit leakage current.

BACKGROUND

A level-shifting circuit can be configured to convert a low-voltage signal to a high-voltage signal and/or a high-voltage signal to a low-voltage signal. Various components within the level shifting circuit can be susceptible to undesirable leakage currents. For example, during some a mode of operation, a portion of a level shifting circuit associated with a high-supply voltage can have an undesirable level of leakage. During another mode of operation, another portion of the level shifting circuit associated with a low-supply voltage can have an undesirable level of leakage. Thus, a need exists for systems, methods, and apparatus to address the shortfalls of present technology and to provide other new and innovative features.

SUMMARY

In one general aspect, a level-shifting circuit includes a first supply terminal configured to receive a first supply voltage, a second supply terminal configured to receive a second supply voltage different from the first supply voltage, an input terminal of the level-shifting circuit configured to receive a voltage having a first voltage level, and an output terminal of the level-shifting circuit. The level-shifting circuit can be configured shift the voltage based on the second supply voltage level to a second voltage level different from the first voltage level. The level-shifting circuit can include a shifting circuit having electrical connections to the input terminal and the output terminal and configured to, in response to a first voltage at a first node, produce a second voltage at a second node. The shifting circuit can include an inverter where the inverter includes a PMOS transistor and an NMOS transistor and the shifting circuit is used to shift the first voltage level to the second voltage level. The level-shifting circuit can also include a feedback circuit having an electrical connection to the first node and the second node where the feedback circuit is configured to maintain the PMOS transistor of the inverter in an OFF state. The level-shifting circuit can also include a clamping circuit having an electrical connection to the first node where the clamping circuit is configured to limit current at the first node.

In another general aspect, a level-shifting circuit includes an input terminal configured to receive an input voltage having a first voltage level and an output terminal. The level-shifting circuit can also include a first having an electrical connection to the input terminal, and a second shifting circuit having an electrical connection to the output terminal. The level-shifting circuit can also include a first voltage supply terminal configured to receive a first supply voltage for the first shifting circuit and a second voltage terminal configured to receive a second supply voltage, different from the first supply voltage, for the second shifting circuit. The level-shifting circuit can further include a clamping circuit having an electrical connection to the second shifting circuit at a node, the clamping circuit configured to limit current at the node.

In another general aspect, a method includes receiving a first supply voltage at a first voltage supply terminal of a level-shifting circuit. The method also includes receiving a second supply voltage, different from the first supply voltage, at a second voltage supply terminal of the level-shifting circuit. The method further includes receiving a voltage having a first voltage level at an input terminal of the level-shifting circuit. The method further includes shifting the voltage from the first voltage level to a second voltage level within the level-shifting circuit based on the second supply voltage such that the voltage at the second voltage level is at an output terminal of the level-shifting circuit. The method further includes receiving a first voltage at a first node in electrical connection with a shifting circuit included in the level-shifting circuit where the first voltage at the first node is based on the voltage at the first voltage level producing a second voltage at a second node using the shifting circuit and the shifting circuit including a transistor. The method can also include, in response to receiving the first voltage at the first node, maintaining the transistor of the shifting circuit in an OFF state using a feedback circuit such that leakage current is limited at the first node.

The details of one or more implementations are set forth in the accompanying drawings and the description below. Other features will be apparent from the description and drawings, and from the claims.

DETAILED DESCRIPTION

The level-shifting circuits described herein include components that limit (e.g., reduce, block) leakage current that can occur during some modes of operation. For example, the level-shifting circuits can include, for example, a clamping circuit and/or a feedback circuit configured to limit leakage current. The level-shifting circuits, because they have decreased leakage current, can be used in a wide variety of applications including low power applications and devices. The implementations described herein are contrasted with conventional level-shifting circuit approaches that are prone to allow undesirable leakage current to flow to ground or within other areas within the circuit.

In some implementations, the level-shifting circuits described herein can include clamping circuit configured to limit current at or from a node within the level-shifting circuit to ground. In some implementations, the level-shifting circuits described herein can include a feedback circuit with electrical connections between nodes that limit current leakage between, for example, ground and a voltage supply that supplies a voltage to the shifting circuit by maintaining a transistor of the shifting circuit in an OFF state.

Figure 1:
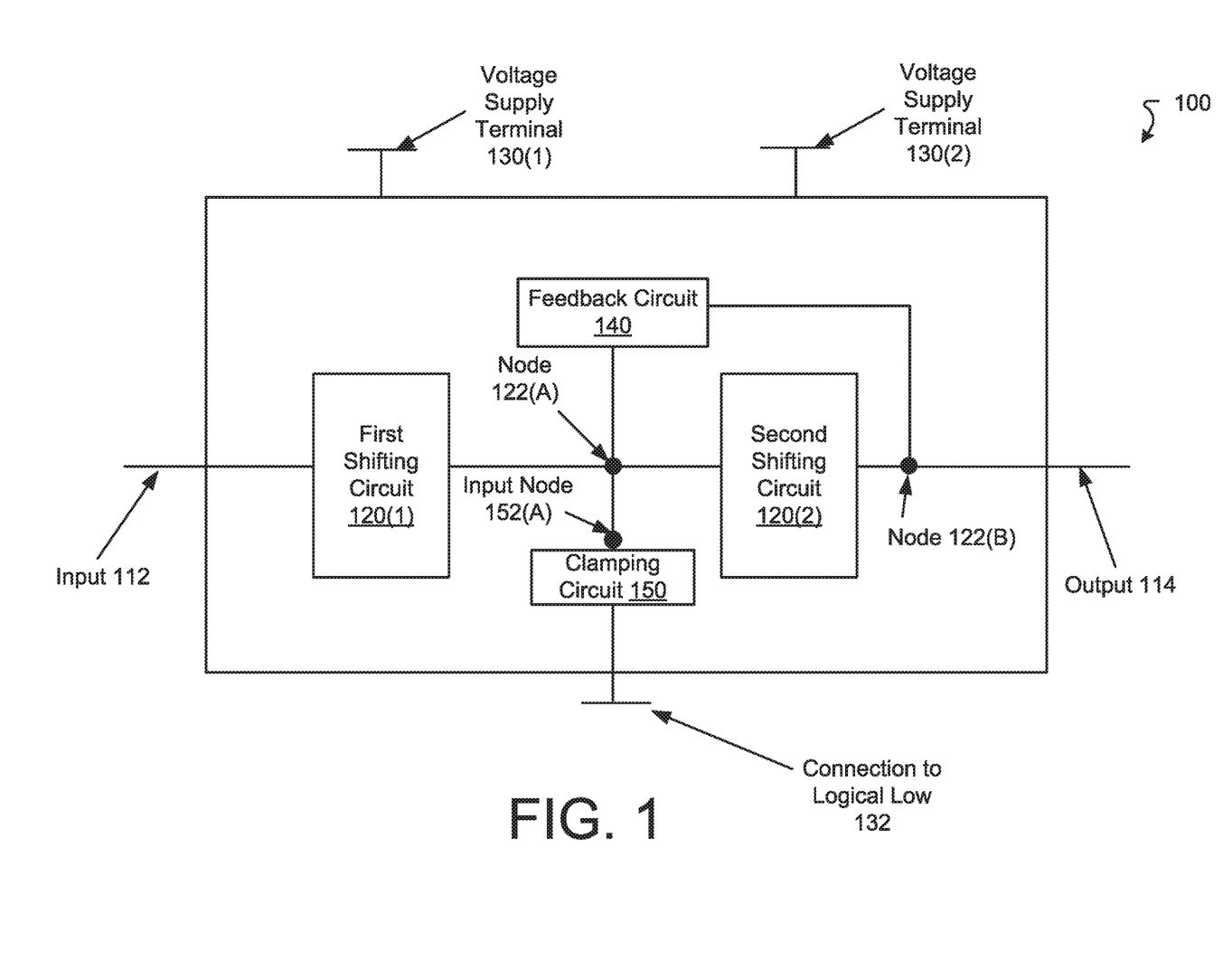
FIG. 1 is a block diagram that illustrates an example level-shifting circuit.

FIG. 1 is a block diagram that illustrates an example level-shifting circuit 100 according to some implementations. The level-shifting circuit 100 includes an input terminal 112 and an output terminal 114, first shifting circuit 120(1) and second shifting circuit 120(2), a first voltage supply terminal 130(1) and a second voltage supply terminal 130(2), a feedback circuit 140, and a clamping circuit 150. The first voltage supply terminal 130(1) is associated with (e.g., provides power to at least some portions of) the first shifting circuit 120(1), and the second voltage supply terminal 130(2) is associated with the second shifting circuit 120(2).

In some implementations, the level-shifting circuit 100 is configured to output a specified voltage at the output terminal 114 in response to receiving a voltage at the input terminal 112. For example, the level shifting circuit 100 is configured to shift a voltage at a first level at the input terminal 112 to a voltage at a second level at the output terminal 112. The voltage at the second level can be higher or lower than the voltage at the first level. As a specific example, in response to receiving a voltage at the input terminal 112, the voltage at the node 122(A) can be equal to a first supply voltage at the first voltage supply terminal 130(1). The voltage at the node 122(B) can be equal to a second supply voltage at the second voltage supply terminal 130(2). The node 122(A) can be an output of the first shifting circuit 120(1) and the node 122(B) can be an output of the second shifting circuit 130(2).

Some level-shifting circuits generate significant and/or undesirable leakage current from a voltage supply to ground, e.g., the higher of the supply voltages supplied to terminals 130(1) and 130(2). The level-shifting circuit 100 is configured to limit leakage current to a desirable level using the feedback circuit 140 and the clamping circuit 150.

In some example implementations, the first shifting circuit 120(1) is configured to receive a voltage having a first voltage level at a node connected to the input terminal 112 and output a voltage having a second voltage level at the node 122(A). In some implementations, the first voltage level is greater than logical low (i.e., ground voltage). In that case, the second voltage level will be equal to a first supply voltage supplied to the first shifting circuit 120(1) by the voltage supply 130(1).

In some example implementations, the second shifting circuit 120(2) is configured to receive a voltage having the second voltage at the node 122(A) and output a signal at the node 122(B) having a third voltage. In some implementations, the third voltage is equal to a second supply voltage supplied to the second shifting circuit 120(2) at the voltage supply terminal 130(2).

In some implementations, the second shifting circuit 120(2) includes an inverter circuit (not shown in FIG. 1). The inverter circuit can have a low voltage threshold and a high voltage threshold. In this case, when the voltage at the node 122(A) is less than the low voltage threshold, the second shifting circuit 120(2) produces the signal having the second voltage at the second node 122(B) such that the second voltage is greater than the first voltage. Also, when the voltage at the node 122(A) is greater than the high voltage threshold, the second shifting circuit 120(2) produces the signal having the second voltage at the second node 122(B) such that the second voltage is less than the first voltage.

In some implementations, the feedback circuit 140 is electrically connected between node 122(A) and node 122(B) and is configured to increase the voltage at the node 122(A) when the voltage at the node 122(A) is greater than the high threshold voltage of the inverter circuit of the second shifting circuit 120(2). Although not shown in FIG. 1, in some implementations, for example, the feedback circuit 140 can be configured to maintain a PMOS transistor of the inverter circuit in an OFF state (i.e., preventing current from flowing between source and drain). When this transistor is maintained in the OFF state, little to no leakage current may be produced from the PMOS transistor. Such implementations are described in more detail in connection with at least, for example, FIG. 2.

In some implementations, the clamping circuit 150 is configured to limit current, specifically leakage current, at the node 122(A). As illustrated in FIG. 1, the clamping circuit 150 limits current from flowing between the node 122(A) and the ground. In some implementations, the clamping circuit 150 limits current from flowing between the node 122(A) and the voltage supply 130(1). In some implementations, the clamping circuit 150 limits current from flowing between the node 122(A) and the voltage supply terminal 130(2). In conjunction with the feedback circuit 140, the clamping circuit 150 can reduce leakage current in the level-shifting circuit 100 down to, for example, the nanoampere level or below.

The level-shifting circuit 100 is configured to block leakage current along various paths depending on the relationship between a first supply voltage applied to the voltage supply terminal 130(1) and a second supply voltage applied to the voltage supply terminal 130(2). Various scenarios are described briefly here, but these scenarios are described in more detail in connection with the examples shown in, for example, FIGS. 4A through 4C.

In one example, when the first supply voltage at the voltage supply terminal 130(1) is less than the second supply voltage at the voltage supply terminal 130(2) and the first voltage is greater than a threshold (e.g., the high voltage threshold of the second shifting circuit 120(2)), leakage current from the node 122(A) to the voltage supply 130(1) may be limited. In such situations, the leakage current may be limited by the feedback circuit 140, and the limited leakage current is blocked from flowing to the voltage supply terminal 130(1) by the clamping circuit 150.

In another example, when the first supply voltage at the voltage supply terminal 130(1) is greater than the second supply voltage at the voltage supply terminal 130(2), leakage current from the node 122(A) to the voltage supply terminal 130(2) may be limited. In such situations, the leakage current may be limited by the clamping circuit 150, and the limited leakage current is blocked from flowing to the voltage supply terminal 130(2) by the clamping circuit 150.

In yet another example, when the first supply voltage is zero, the voltage at node 122(A) will be lower than the low threshold voltage of the second shifting circuit 120(2), and the leakage current from the node 122(A) to ground may be limited. In such situations, the leakage current may be blocked by the clamping circuit 150 from flowing toward the ground.

Figure 2:
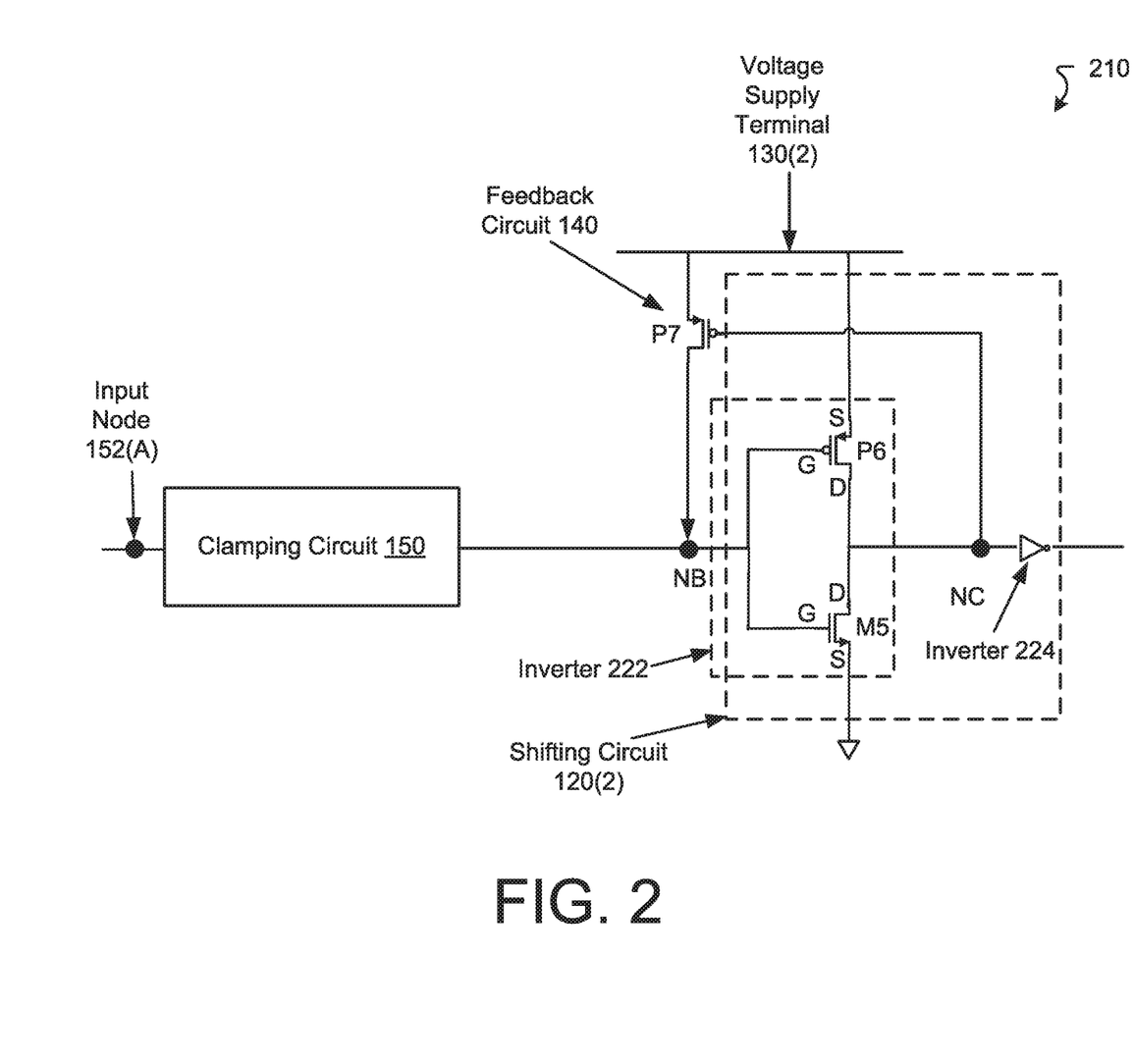
FIG. 2 is a diagram that illustrates an example shifting circuit and feedback circuit.

FIG. 2 is a diagram illustrating an example of a portion 210 of a level-shifting circuit. The portion 210 of the level-shifting circuit includes an example of the second shifting circuit shifting circuit 120(2), the feedback circuit 140, and the clamping circuit 150 shown in FIG. 1. Accordingly, the portion 210 of the level-shifting circuit can be included in the level-shifting circuit 100 shown in FIG. 1.

The level-shifting circuit 120(2) includes inverters 222 and 224. As shown in FIG. 2, the inverter circuit 222 includes a PMOS transistor P6 and a NMOS transistor M5. In this example implementation, the inverter 222 is configured to output a low voltage at node NC in response to a high voltage at node NB, and configured to output a high voltage at node NC in response to a low voltage at node NB. The inverter 224 performs a similar high/low voltage inversion with respect to the node NC and an output of the second shifting circuit 120(2).

A source S and a gate G of the PMOS transistor P6 have, respectively, electrical connections to the voltage supply rail 130(2) and the node NB, which is the input to the second shifting circuit 120(2). A source S and a gate G of the NMOS transistor M5 have, respectively, electrical connections to ground and the node NB. A drain D of the NMOS transistor M5 has an electrical connection to the drain D of the PMOS transistor P6.

When the voltage at the node NB is less than a low voltage threshold of the inverter circuit 222, the voltage at the node NC will be high. Further, when the voltage at the node NB is greater than a high voltage threshold of the inverter circuit 222, the voltage at the node NC will be low.

The feedback circuit 140 is configured to increase (e.g., pull up, raise) the voltage at the NB when the voltage at the NB is greater than the high threshold voltage of the inverter circuit of the second shifting circuit 120(2). Specifically, the feedback circuit 140 increases this voltage to maintain the PMOS transistor P6 in an OFF state. Because the leakage current can be produced when the PMOS transistor P6 is in the ON state (or a linear state), maintaining the PMOS transistor P6 in the OFF state reduces the leakage current through the inverter 222.

The clamping circuit 150 is configured to limit a leakage current that can flow to either of the voltage supply terminals 130(1) and 130(2) and/or a ground. In some implementations, the voltage at the node NB depends on whether the voltage at the input node 152(A) of the clamping circuit is less than the low voltage threshold or greater than the high voltage threshold.

Figure 3:
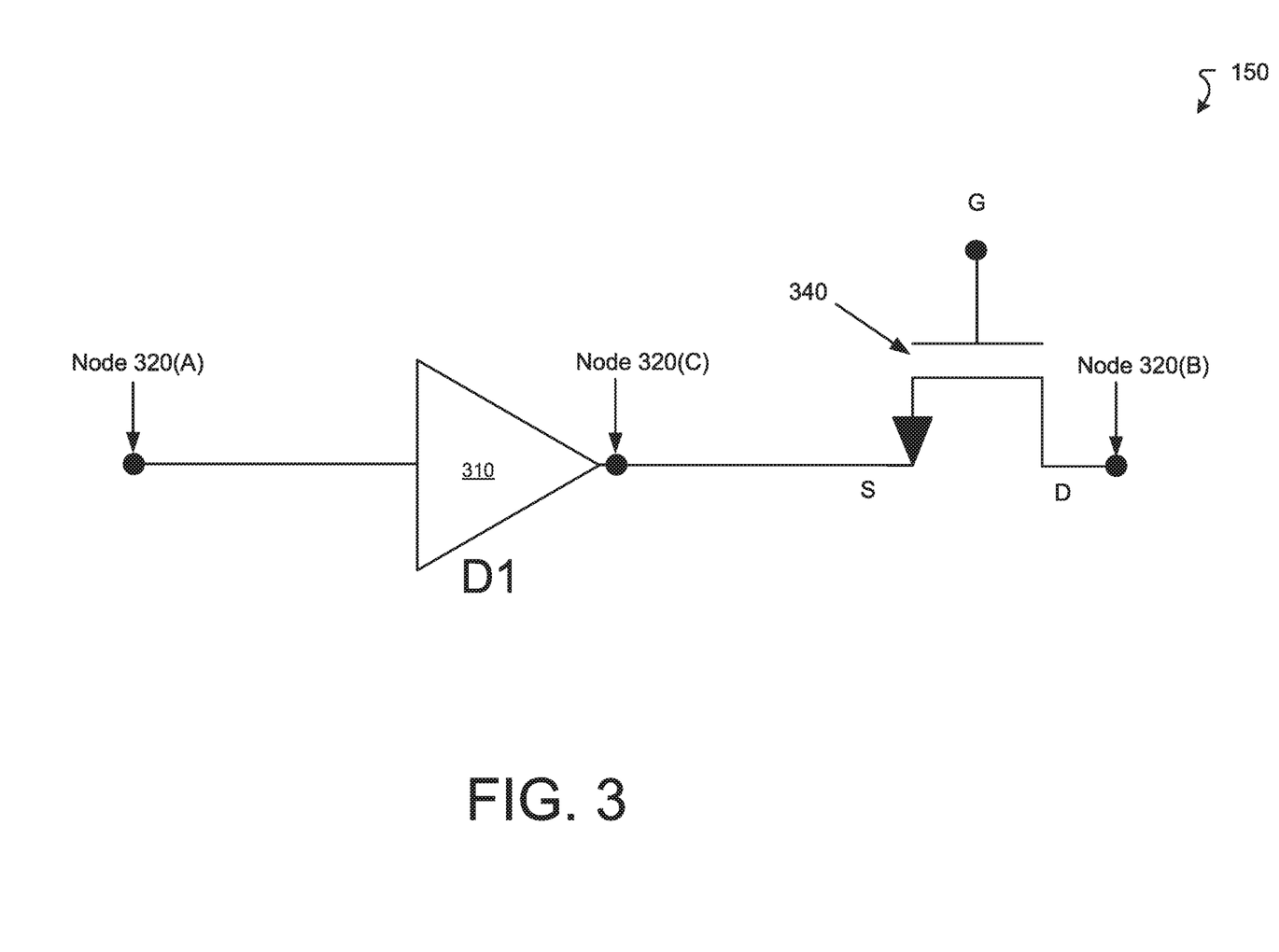
FIG. 3 is a diagram illustrating a detailed example of the clamping circuit shown in FIGS. 1 and 2 according to some implementations.

FIG. 3 is a diagram illustrating a detailed example of the clamping circuit 150 shown in FIGS. 1 and 2. As shown in FIG. 3, the clamping circuit 150 includes a Schottky barrier diode (SBD) 310 and a native NMOS transistor 340 (e.g., a NMOS transistor with a threshold voltage that is less than zero). The voltage across the SBD 310 is limited to the threshold voltage of the native NMOS transistor 340 such that, when the reverse-bias voltage across the SBD 310 is low, the leakage current that flows across the SBD 310 is low. Accordingly, the clamping circuit 150 is configured to limit current along the reverse-biased direction. For example, the clamping circuit 150 can limit current from node 320(B) to node 320(A).

The SBD 310 is reverse-biased with respect to current flow from the node 320(B) (at a source D of the NMOS transistor 340). When the voltage at the node 320(A) is equal to the first supply voltage supplied by a voltage at the gate G, the voltage at the node 320(B) is equal to a difference between the first supply voltage and the forward-biased voltage across the SBD 310.

The native NMOS transistor 340 is configured to be ON and operating in saturation mode when the voltage at the node 320(B) is greater than the voltage at the node 320(A). These conditions permit current to flow through the clamping circuit 150 from the node 320(B) to the node 320(A). In this case, the voltage at the node 320(C) (at a source S of the NMOS transistor 340) is equal to a sum of the first supply voltage and the absolute value of the threshold voltage of the native NMOS resistor 340. Accordingly, the voltage across the SBD 310 is about equal to the absolute value of the threshold voltage of the native NMOS transistor 340. Because the leakage current of the reverse-biased SBD diode 310 changes with the absolute value of the threshold voltage of the native NMOS resistor 340, the smaller the threshold voltage of the native NMOS transistor 340, the smaller the leakage current of the reverse-biased SBD diode 310. In the worst condition, the threshold voltage of the native NMOS resistor 340 can be relatively small (e.g., as small as possible, negligible in some applications) in absolute value.

In some implementations, the above configuration of the SBD diode 310 and the native NMOS resistor 340 as show in FIG. 3 may be replaced with a normal NMOS transistor. Nevertheless, such a replacement may be effective when the first supply voltage is greater than a sum of the high voltage threshold of the inverter circuit 222 and the threshold voltage of the normal NMOS transistor. In this case, the voltage drop across the NMOS can be relatively large and can accordingly limit the current at the node 320(A).

Figure 4A:
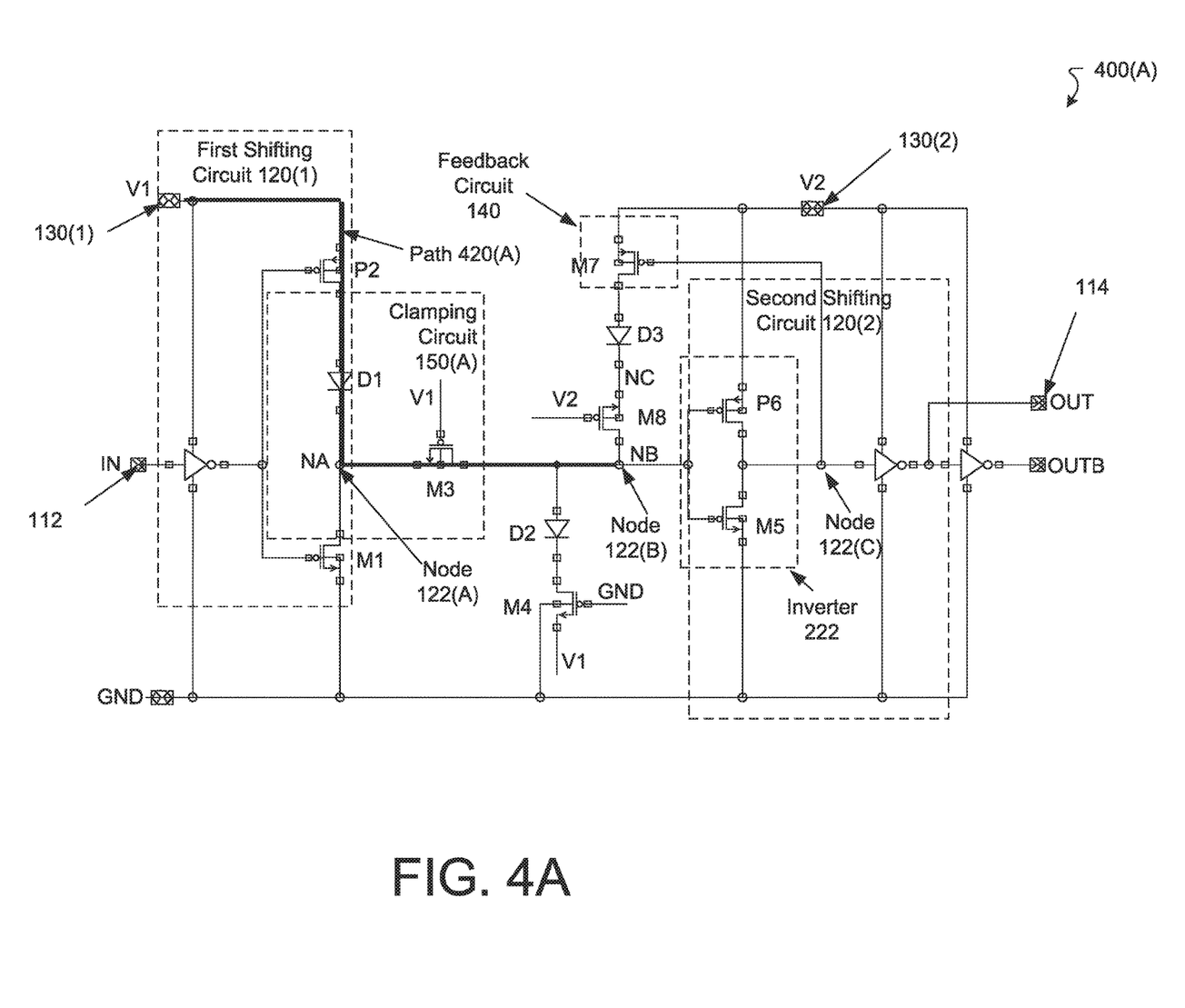
FIGS. 4A-4D are diagrams illustrating an example level-shifting circuit for various values of a supply voltage.
Figure 4B:
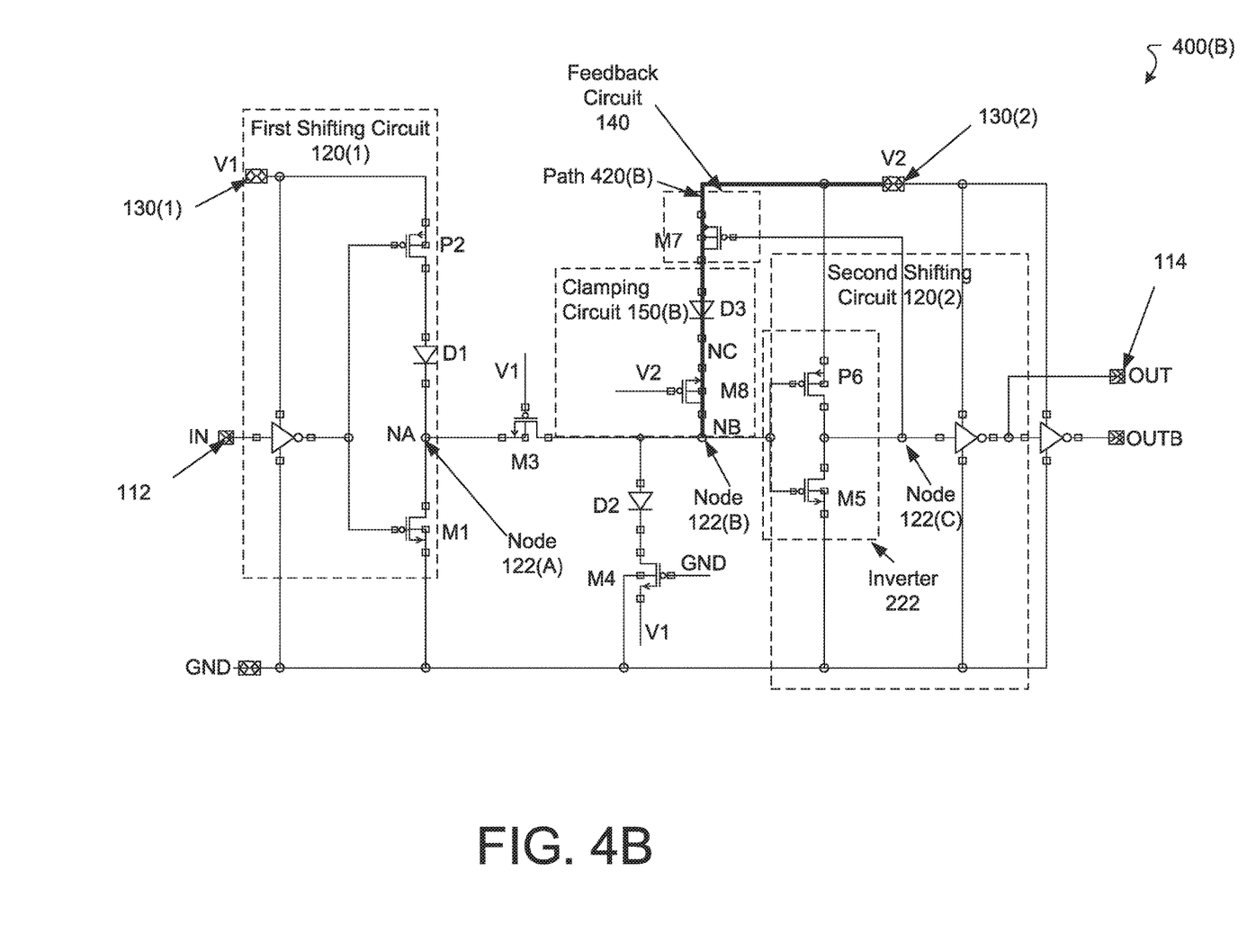
Figure 4C:
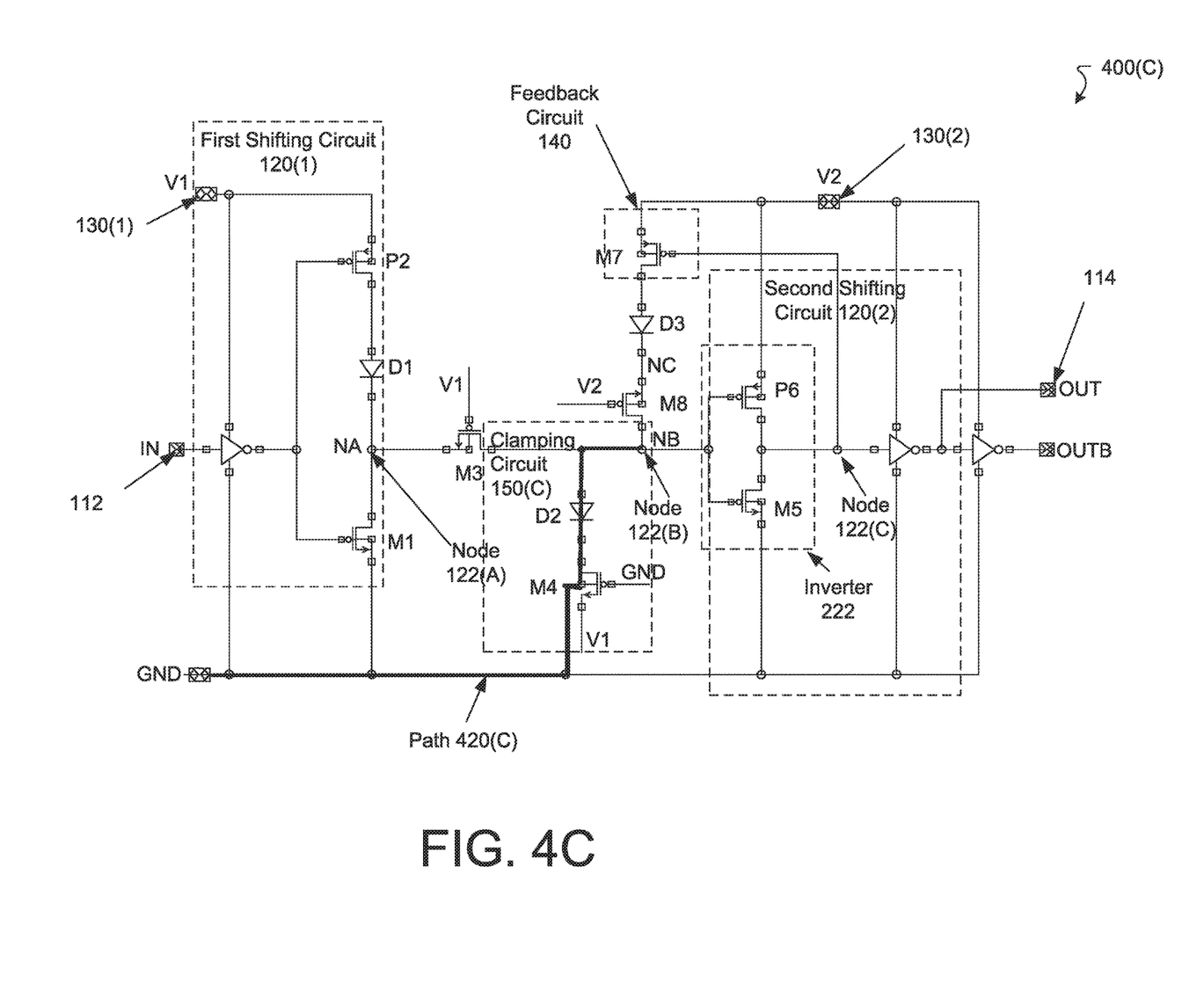

FIGS. 4A through 4C are circuit diagrams that illustrate a level-shifting circuit 400 configured to limit leakage current along various paths 420. FIGS. 4A through 4C highlight aspects of the same level-shifting circuit 400 in different scenarios (which are labeled, respectively, as 400(A) through 400(C)).

FIG. 4A is a diagram of an example level-shifting circuit 400(A) for the case when the first supply voltage V1 is less than the second supply voltage V2. The level-shifting circuit 400(A) includes clamping circuit 150(A), first shifting circuit 120(1), second shifting circuit 120(2), and feedback circuit 140, which can include PMOS transistor P7.

When the voltage at the input terminal 112 of the level-shifting circuit 400(A) is low and 0<V1<V2, the PMOS transistor P7 is in the OFF state and the leakage current is limited along a path 420(A). This may occur, for example, when the voltage at the input terminal 112 is equal to the ground voltage or less than the low voltage threshold of the inverter circuit 222 of the shifting circuit 120(2) defined by the transistors M5 and P6.

When the voltage at the input terminal 112 of the level-shifting circuit 400(A) is high and 0<V1<V2, then the feedback circuit 140 limits leakage current produced by the second shifting circuit 120(2) by maintaining the transistor P6 in the OFF state. This may occur, for example, when the voltage at the input terminal 112 is equal to V1 or greater than the low voltage threshold of the inverter circuit of the shifting circuit 120(2). In this case, the leakage current is limited along the path 420(A) from the node 122(B) to the first supply voltage 130(1) supplying the voltage V1 via the PMOS transistor P2. Nevertheless, the clamping circuit 150(A), which includes the native NMOS transistor M3 that maintains a gate at the voltage V1, limits leakage current from flowing along the path 420(A).

FIG. 4B is a diagram of an example level-shifting circuit 400(B) for the case when the first supply voltage V1 is greater than the second supply voltage V2. The level-shifting circuit 400(B) includes clamping circuit 150(B), first shifting circuit 120(1), second shifting circuit 120(2), and feedback circuit 140, which can include PMOS transistor P7.

When the voltage at the input terminal 112 of the level-shifting circuit 400(B) is low and V1>V2>0, the NMOS transistor P7 is in the OFF state and the leakage current is limited along a path 420(B). This may occur, for example, when the voltage at the input terminal 112 is equal to the ground voltage or less than the low voltage threshold of the inverter circuit 222 of the shifting circuit 120(2) defined by the transistors M5 and P6.

When the voltage at the input terminal 112 of the level-shifting circuit 400(B) is high and V1>V2>0, then the clamping circuit 150(B) limits leakage current along the path 420(B). Also, the leakage current of the second shifting circuit 120(2) is limited by maintaining the PMOS transistor P6 in the OFF state. Since V1>V2, for the PMOS transistor P6 to be in the OFF state, the voltage at the node NB should be greater than V2. In this situation, the PMOS transistor M7 is in the ON state, not the OFF state. The feedback circuit 140, which includes PMOS transistor M7, limits leakage current produced by the second shifting circuit 120(2) by maintaining the transistor P6 in the OFF state. This may occur, for example, when the voltage at the input terminal 112 is equal to V1 or greater than the high voltage threshold of the inverter circuit of the shifting circuit 120(1). In this case, leakage current may be limited along the path 420(B). Accordingly, the clamping circuit 150(B), which includes the native NMOS transistor M8 having a gate held at the voltage V2, limits leakage current from flowing along the path 420(B).

FIG. 4C is a diagram of example level-shifting circuit 400(C) for the case when V1=0 and V2>0. The level-shifting circuit 400(C) includes clamping circuit 150(C), first shifting circuit 120(1), and second shifting circuit 120(2).

The gate of the native NMOS transistor M4 is maintained at ground to maintain the native NMOS transistor M4, as the source of M4 is held at the voltage V1. Accordingly, the native NMOS transistor M4 of the clamping circuit 150(C) is ON and pulls down the voltage at the node 122(B) to reduce that voltage to less than the low voltage threshold of the inverter circuit of the shifting circuit 120(2) defined by the transistors M5 and P6. By pulling the voltage at node 122(B) lower than the low voltage threshold, leakage current that could flow to ground is limited.

Figure 4D:
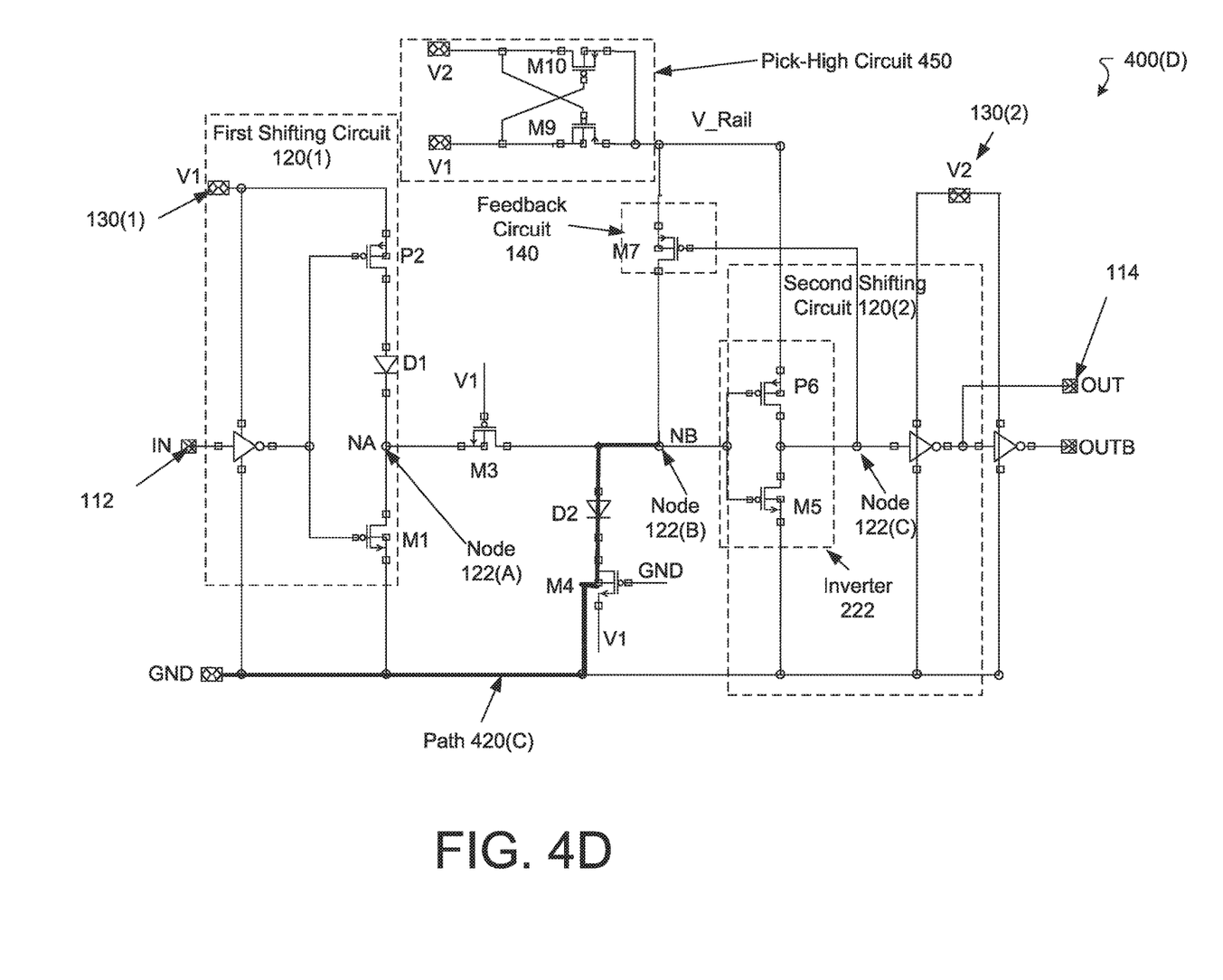

FIG. 4D is a diagram of example level-shifting circuit 400(D). In this case, rather than the second voltage supply terminal 130(2) supplying the second supply voltage V2 to the inverter 222, there is a pick-high circuit 450 supplying a rail voltage V_Rail to the inverter 222. The rail voltage V_Rail is the higher of the voltages V1 and V2. Because the rail voltage V_Rail is not less than the second supply voltage V2, there will not be any significant leakage current generated at the inverters supplied by the second voltage supply terminal 130(2). Also, the diode D3 and transistor M8 have been removed because the voltage V1 is not higher than V_Rail.

Figure 5:
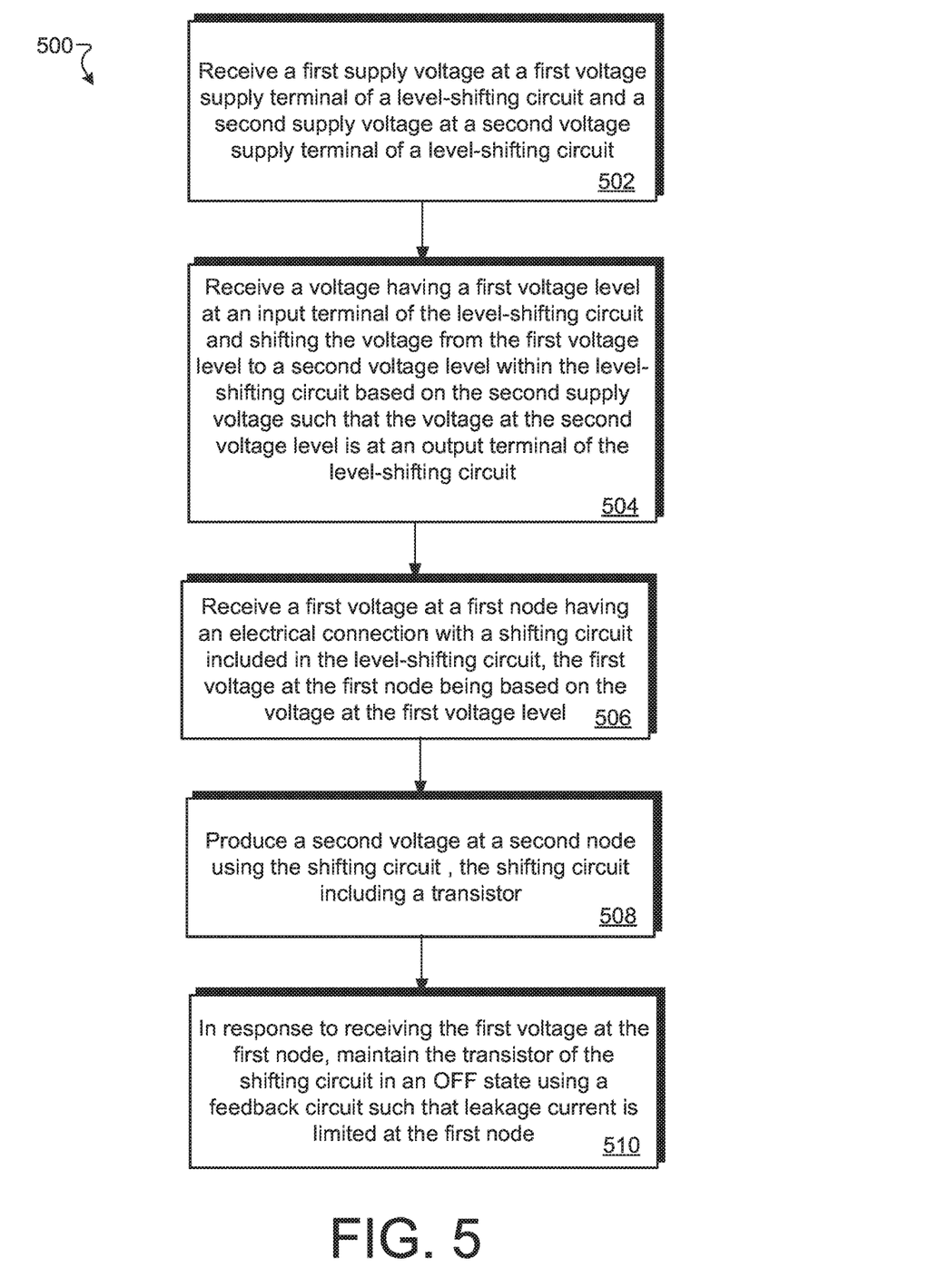
FIG. 5 is a flow chart that illustrates an example method related to the level-shifting circuits described herein.

FIG. 5 is a flow chart that illustrates an example method 500 related to the level-shifting circuits described herein. At 502, the level-shifting circuit receives a first supply voltage at a first voltage supply terminal of a level-shifting circuit and a second supply voltage, different from the first supply voltage, at a second voltage supply terminal. The first voltage supply terminal may be, in some implementations, the first voltage supply terminal 130(1). The second voltage supply terminal may be, in some implementations, the second voltage supply terminal 130(2).

At 504, the level-shifting circuit receives a voltage having a first voltage level at an input terminal and shifts the voltage from the first voltage level to a second voltage level within the level-shifting circuit based on the second supply voltage such that the voltage at the second voltage level is at an output terminal. The input terminal may be, in some implementations, the input terminal 112 of the level-shifting circuit. The output terminal may be, in some implementations, the output terminal 114 of the level-shifting circuit.

At 506, the level-shifting circuit receives a first voltage at a first node having an electrical connection with a shifting circuit, the first voltage at the first node being based on the voltage at the first voltage level. In some implementations, the first node is the node 122(A). In some implementations, the shifting circuit is the shifting circuit 120(2) included in the level-shifting circuit.

At 508, the level-shifting circuit produces a second voltage at a second node using the shifting circuit. The shifting circuit includes a transistor, e.g., PMOS P6. In some implementations, the second node is the node 122(B).

At 510, the level-shifting circuit, in response to receiving the first voltage at the first node, maintains the transistor of the shifting circuit in an OFF state using a feedback circuit such that leakage current is limited at the first node. In some implementations, the feedback circuit is the feedback circuit 140.

FIGS. 6A-6E are diagrams illustrating plots of voltage and current within an example level-shifting circuit. The diagrams illustrate behavior of the level-shifting circuit 100 as a function of time. Also shown in FIGS. 6A-6E are times T2 and T3 at which leakage current measurements at specified nodes are made. These plots demonstrate that the level-shifting circuits described herein can limit the leakage current to relatively low levels. In this implementation, the first supply voltage is less than the second supply voltage. In some implementations, the first supply voltage can be approximately half of the second supply voltage (e.g., V1=VL=2.8 V, V2=VH=5.5 V).

Figure 6A:
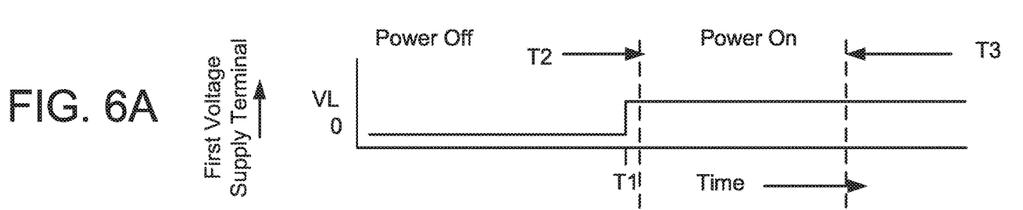
FIGS. 6A-6E are diagrams illustrating plots of voltage and current at the input and output of an example level-shifting circuit for a first value of a supply voltage.

FIG. 6A shows the voltage supplied to the level-shifting circuit at the first voltage supply terminal as a function of time, i.e. the value of V1. In this case, the first supply voltage is turned on at time T1. In some implementations, the first voltage supply terminal is the first supply voltage terminal 130(1).

Figure 6B:
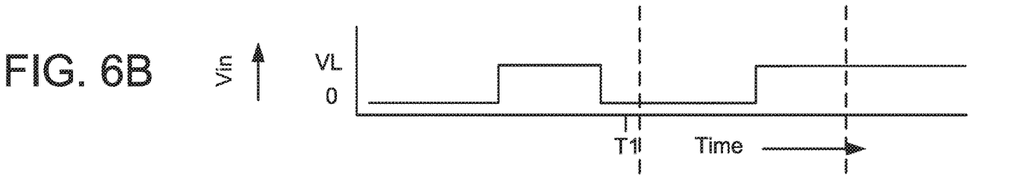

FIG. 6B shows an example voltage of a signal at an input terminal of the level-shifting circuit. The example voltage alternates between 0 V and voltage VL as the voltage supplied at the first voltage supply terminal alternates between 0 and voltage VL. The input terminal may be, in some implementations, the input terminal 112 of the level-shifting circuit.

Figure 6C:
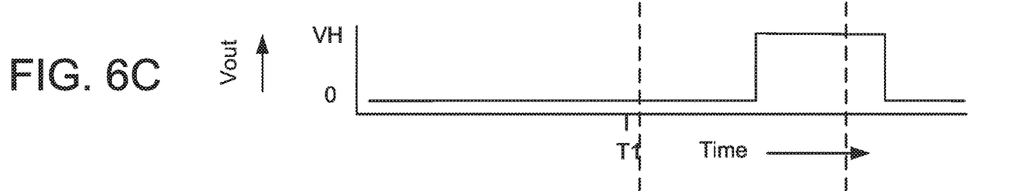

FIG. 6C shows an example voltage of a signal at an output terminal of the level-shifting circuit. When there is no voltage supplied at the first supply voltage terminal, there is zero voltage at the output terminal. When voltage is supplied at the first supply voltage terminal, the voltage at the output terminal essentially follows the voltage signal at the input terminal, except that the voltage at the output is shifted to voltage VH=V2. The output terminal may be, in some implementations, the output terminal 114 of the level-shifting circuit.

Figure 6D:
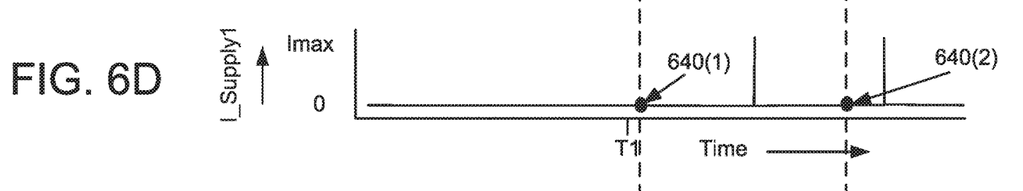

FIG. 6D shows an example current at node 122(B) as illustrated in FIG. 4A. The spikes shown correspond to the voltage at the node 122(B) changing from low to high, and then from high to low. The current measurements 640(1) and 640(2) at the respective times T2 and T3 are leakage currents at the node 122(B) that are in the picoampere range, i.e., 9.2 pA and −4.4 pA, respectively.

Figure 6E:
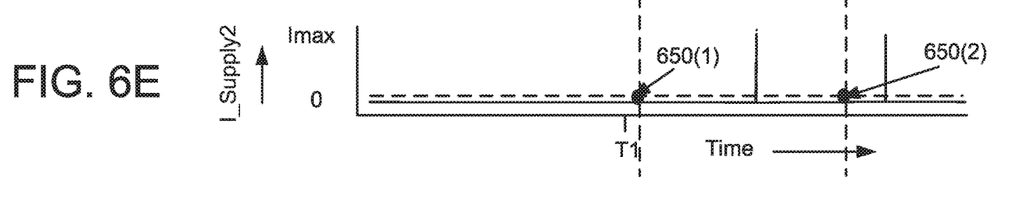

FIG. 6E shows an example current at node 122(C) as illustrated in FIG. 4A. The spikes shown correspond to the voltage signal changing from low to high, and then from high to low. The current measurements at the times T2 and T3 are leakage currents that are in the picoampere range, i.e., 3.2 pA and 15 pA, respectively.

FIGS. 7A-7E are diagrams illustrating plots of voltage and current within an example level-shifting circuit as a function of time. Also shown in FIGS. 7A-7E are times T2 and T3 at which leakage current measurements at specified nodes are made. These plots demonstrate that the level-shifting circuits described previously limit the leakage current to very low levels, independent of whether the first supply voltage level or the second supply voltage level is larger. In this implementation, the first supply voltage can be greater than the second supply voltage. In some implementations, the first supply voltage can be approximately two times greater than the second supply voltage (e.g., V1=VH=5.5 V, V2=VL=2.8 V).

Figure 7A:
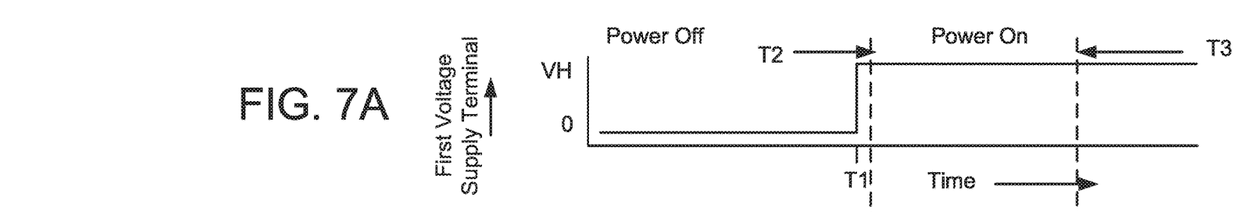
FIGS. 7A-7E are diagrams illustrating plots of voltage and current at the input and output of an example level-shifting circuit for a second value of a supply voltage.

FIG. 7A shows the voltage supplied to the level-shifting circuit at the first voltage supply terminal as a function of time, i.e. the value of V1. In this case, the first supply voltage is turned on at time T1. In some implementations, the first voltage supply terminal is the first supply voltage terminal 130(1).

Figure 7B:
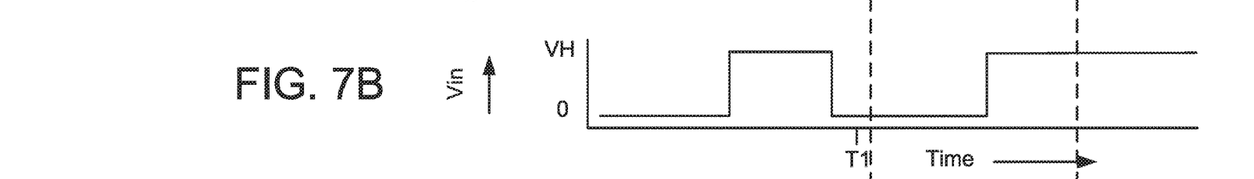

FIG. 7B shows an example voltage of a signal at an input terminal, e.g., input terminal 112 of the level-shifting circuit. The example voltage alternates between 0 V and voltage V1=VH as the voltage supplied at the first voltage supply terminal alternates between 0 and V1. The input terminal may be, in some implementations, the input terminal 112 of the level-shifting circuit.

Figure 7C:
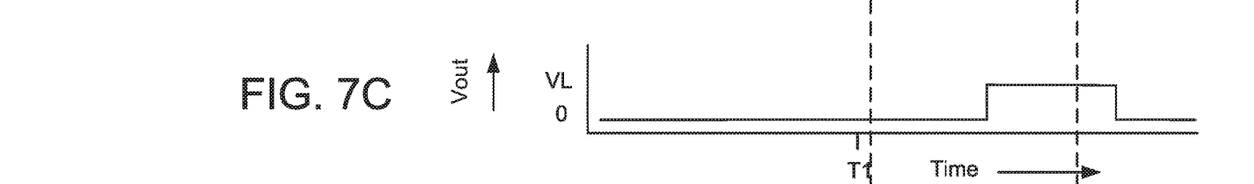

FIG. 7C shows an example voltage of a signal at an output terminal, e.g., output terminal 114 of the level-shifting circuit. When there is no voltage supplied at the first supply voltage terminal, there is zero voltage at the output terminal. When voltage is supplied at the first supply voltage terminal, the voltage at the output terminal essentially follows the voltage signal at the input terminal, except that the voltage at the output is shifted to V2, or 2.8V.

Figure 7D:
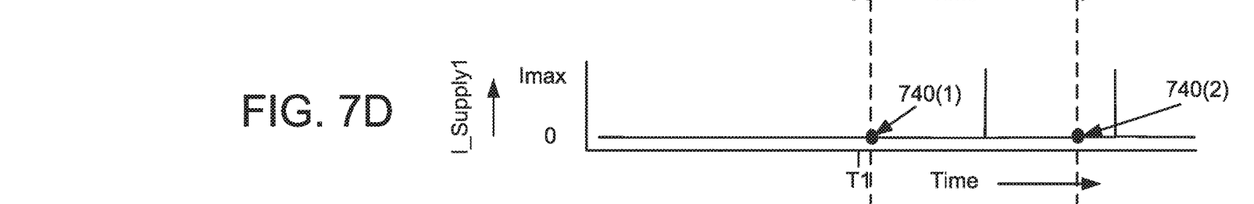

FIG. 7D shows an example current at node 122(B) as illustrated in FIG. 4A. The spikes shown correspond to the voltage at the node 122(B) changing from low to high, and then from high to low. The current measurements at the times T2 and T3 are leakage currents at the node 122(B) that are in the picoampere range, i.e., 51 pA and 11 pA, respectively.

Figure 7E:
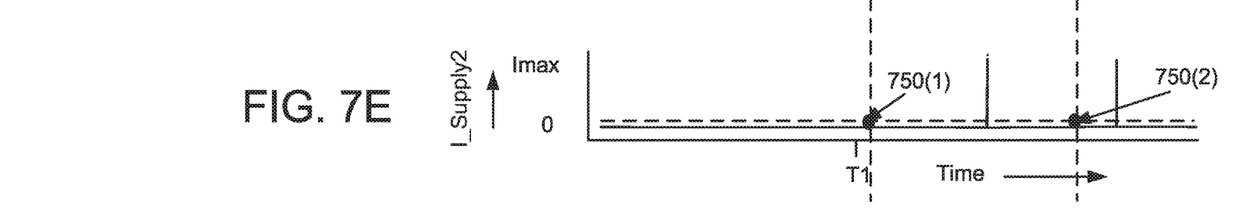

FIG. 7E shows an example current at node 122(C) as illustrated in FIG. 4A. The spikes shown correspond to the voltage signal changing from low to high, and then from high to low. The current measurements at the times T2 and T3 are leakage currents that are in the picoampere range, i.e., 0.25 pA and −4.7 pA, respectively.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing technologies associated with semiconductor substrates including, but not limited to, for example, Silicon (Si), Galium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A level-shifting circuit, comprising:
   a first supply terminal configured to receive a first supply voltage;
   a second supply terminal configured to receive a second supply voltage different from the first supply voltage;
   an input terminal of the level-shifting circuit configured to receive a voltage having a first voltage level;
   an output terminal of the level-shifting circuit, the level-shifting circuit configured shift the voltage based on the second supply voltage level to a second voltage level different from the first voltage level;
   a shifting circuit having electrical connections to the input terminal and the output terminal and configured to, in response to a first voltage at a first node, produce a second voltage at a second node, the shifting circuit including an inverter, the inverter including a transistor, the shifting circuit being used to shift the first voltage level to the second voltage level; and
   a clamping circuit having an electrical connection to the first node, the clamping circuit being configured to limit current at the first node from flowing to a ground.

2. The level-shifting circuit of claim 1, further comprising:
   a feedback circuit having an electrical connection to the first node and the second node.

3. The level-shifting circuit of claim 2, wherein the feedback circuit includes a PMOS transistor, the PMOS transistor including a source and a gate, the source having an electrical connection to a second supply voltage different from the first supply voltage, the gate having an electrical connection to the second node.

4. The level-shifting circuit of claim 1, wherein:
   the inverter has a low voltage threshold and a high voltage threshold greater than the low voltage threshold, and
   the shifting circuit configured to produce the second voltage at the second node in response to the first voltage at the first node is further configured to:
      produce the second voltage at the second node in response to the first voltage at the first node being less than the low voltage threshold of the inverter, the second voltage being greater than the first voltage; and
      produce the second voltage at the second node in response to the first voltage at the first node being greater than the high voltage threshold of the inverter, the second voltage being less than the first voltage.

5. The level-shifting circuit of claim 4, wherein the clamping circuit has an electrical connection to an input node;
   the clamping circuit being further configured to, in response to a voltage less than the low voltage threshold of the shifting circuit at the input node, produce the first voltage at the first node.

6. The level-shifting circuit of claim 1, wherein:
   the clamping circuit includes a Schottky barrier diode and a NMOS transistor having a negative threshold voltage, and a voltage supply terminal configured to supply the first supply voltage to the NMOS transistor.

7. The level-shifting circuit of claim 1, wherein the clamping circuit is configured to pull the first voltage at the first node lower than a low voltage threshold of the inverter of the shifting circuit.

8. The level-shifting circuit of claim 1, wherein the clamping circuit includes a Schottky barrier diode and a NMOS transistor, the NMOS transistor is ON when the current at the first node is limited.

9. The level-shifting circuit of claim 1, further comprising:
   a pick-high circuit configured to supply a rail voltage to the inverter.

10. The level-shifting circuit of claim 1, wherein the clamping circuit includes a NMOS transistor having a gate coupled to the ground.

11. A level-shifting circuit, comprising:
   an input terminal configured to receive an input voltage having a first voltage level;
   an output terminal;
   a first shifting circuit having an electrical connection to the input terminal;
   a first voltage supply terminal configured to receive a first supply voltage for the first shifting circuit;
   a second shifting circuit having an electrical connection to the output terminal;
   a second voltage terminal configured to receive a second supply voltage, different from the first supply voltage, for the second shifting circuit,
   the level-shifting circuit configured to shift the input voltage, based on the second supply voltage, to a second voltage level different from the first voltage level; and
   a clamping circuit having an electrical connection to the second shifting circuit at a node, the clamping circuit configured to limit a current at the node, the clamping circuit is configured to limit the current from flowing to a ground.

12. The level-shifting circuit of claim 11, wherein:
   the first shifting circuit includes a PMOS transistor,
   the first supply voltage is less than the second supply voltage, and
   the clamping circuit configured to limit current at the node is further configured to limit the current from flowing to ground via an NMOS transistor.

13. The level-shifting circuit of claim 11, wherein:
   the level-shifting circuit further comprises a feedback circuit having an electrical connection to the node, the feedback circuit including a PMOS transistor.

14. The level-shifting circuit of claim 10, wherein the clamping circuit is configured to maintain a voltage at the node lower than the low voltage threshold of an inverter circuit in the shifting circuit.

15. The level-shifting circuit of claim 11, further comprising:
   an inverter circuit in the shifting circuit; and
   a pick-high circuit configured to supply a rail voltage to the inverter circuit.

16. The level-shifting circuit of claim 11, wherein the first supply voltage is zero.

17. A method, comprising
   receiving a first supply voltage at a first voltage supply terminal of a level-shifting circuit;
   receiving a second supply voltage, different from the first supply voltage, at a second voltage supply terminal of the level-shifting circuit;
   receiving a voltage having a first voltage level at an input terminal of the level-shifting circuit;
   shifting the voltage from the first voltage level to a second voltage level within the level-shifting circuit based on the second supply voltage such that the voltage at the second voltage level is at an output terminal of the level-shifting circuit;

receiving a first voltage at a first node having an electrical connection with a shifting circuit included in the level-shifting circuit, the first voltage at the first node being based on the voltage at the first voltage level;

producing a second voltage at a second node using the shifting circuit, the shifting circuit including a transistor; and in response to receiving the first voltage at the first node limiting a current from the first node to ground.

18. The method of claim 17, wherein:

the shifting circuit has an inverter, the inverter having a low voltage threshold and a high voltage threshold greater than the low voltage threshold, and producing the second voltage includes:

generating the second voltage at the second node in response to the first voltage at the first node being less than the low voltage threshold of the inverter, the second voltage being greater than the first voltage; and generating the second voltage at the second node in response to the first voltage at the first node being greater than the high voltage threshold of the inverter, the second voltage being less than the first voltage.

19. The method of claim 18, wherein limiting the current at the first node includes:

in response to receiving a small voltage less than the low voltage threshold of the inverter at an input node having an electrical connection to a clamping circuit configured to limit the current at the first node, producing the small voltage at the first node.

20. The method of claim 17, further comprising:

limiting the current at the first node using a clamping circuit including a Schottky barrier diode, a NMOS transistor having a negative threshold voltage, and a voltage supply terminal configured to supply the first supply voltage to the NMOS transistor, the clamping circuit having an electrical connection to an input node.

21. The method of claim 20, wherein the clamping circuit includes a Schottky barrier diode and a NMOS transistor, the NMOS transistor is ON when the current at the first node is limited.

* * * * *